United States Patent
Chen et al.

(10) Patent No.: US 7,525,815 B2
(45) Date of Patent: Apr. 28, 2009

(54) DEVICE FOR ASSEMBLYING TRANSVERSAL PCI EXPANSION CARDS AND A COMPUTER HOUSING

(75) Inventors: Richard Chen, San Jose, CA (US); Yen-Lun Lee, Fremont, CA (US)

(73) Assignee: Super Micro Computer, Inc., San Jose, CA (US)

( * ) Notice: Subject to any disclaimer, the term of this patent is extended or adjusted under 35 U.S.C. 154(b) by 0 days.

(21) Appl. No.: 11/892,589

(22) Filed: Aug. 24, 2007

(65) Prior Publication Data

US 2009/0055567 A1   Feb. 26, 2009

(51) Int. Cl.
*H01R 12/16* (2006.01)
(52) U.S. Cl. .................. 361/788; 361/756; 361/755
(58) Field of Classification Search ............... 361/752, 361/790, 797, 800, 755, 756, 807, 810, 727, 361/683, 741, 686; 312/223
See application file for complete search history.

(56) References Cited

U.S. PATENT DOCUMENTS

| | | | | |
|---|---|---|---|---|
| 5,715,146 A | * | 2/1998 | Hoppal | 361/796 |
| 5,740,020 A | * | 4/1998 | Palatov | 361/796 |
| 5,943,215 A | * | 8/1999 | Carney et al. | 361/756 |
| 5,963,681 A | * | 10/1999 | Clements | 385/14 |
| 6,999,319 B2 | * | 2/2006 | Wu et al. | 361/724 |

* cited by examiner

*Primary Examiner*—Hung S Bui
(74) *Attorney, Agent, or Firm*—Troxell Law Office, PLLC

(57) ABSTRACT

A device for assembling transversal PCI expansion cards and a computer housing includes a vertical connection board which is installed in an internal space of a computer housing, with a riser card being fixed on the connection board. The riser card is provided with a plurality of insertion slots, and a side of the connection board is provided with a plurality of brackets, such that tail ends of PCI expansion cards can be horizontally locked on the brackets, thereby allowing more PCI expansion cards, which are superimposed, to be horizontally inserted in a limited space of the computer housing.

5 Claims, 8 Drawing Sheets

DEVICE FOR ASSEMBLYING TRANSVERSAL PCI EXPANSION CARDS AND A COMPUTER HOUSING

BACKGROUND OF THE INVENTION a) Field of the Invention

The present invention relates to a device for assembling transversal PCI expansion cards and a computer housing, and more particularly to a device which sufficiently uses a space inside a computer housing to assemble more PCI expansion cards.

b) Description of the Prior Art

For a conventional computer housing, particularly a computer housing with a height of 4 U, its PCI expansion cards are only designed to be inserted longitudinally on a circuit motherboard. In terms of an industrial computer host, as there are a lot of machine tools to be controlled by the host, and more functions are required correspondingly, such as that the functions of remote image signals, data, and sound are required in versatility, more PCI expansion cards should be installed inside the computer housing to support the functions required by a server for controlling the machine tools. Accordingly, how to construct a lot more PCI expansion cards in a limited space inside the computer housing with the height of 4 U is an issue to be pursued by the present invention.

SUMMARY OF THE INVENTION

Accordingly, the primary object of the present invention is to provide a device for assembling transversal PCI expansion cards and a computer housing, wherein a space inside a computer housing is provided with at least one vertical connection board which is selectively connected, and a riser card which is fixed on the connection board, with a plurality of slots being formed on the riser card, and a plurality of brackets being installed at a side of the connection board, such that insertion ends of the transversal PCI expansion cards, for signal transmission, can be horizontally inserted into the slots of the riser card, and tail ends of board surfaces of the PCI cards can be locked on the brackets, thereby achieving a function of horizontally inserting more PCI expansion cards, which are superimposed, in a limited space of the computer housing.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
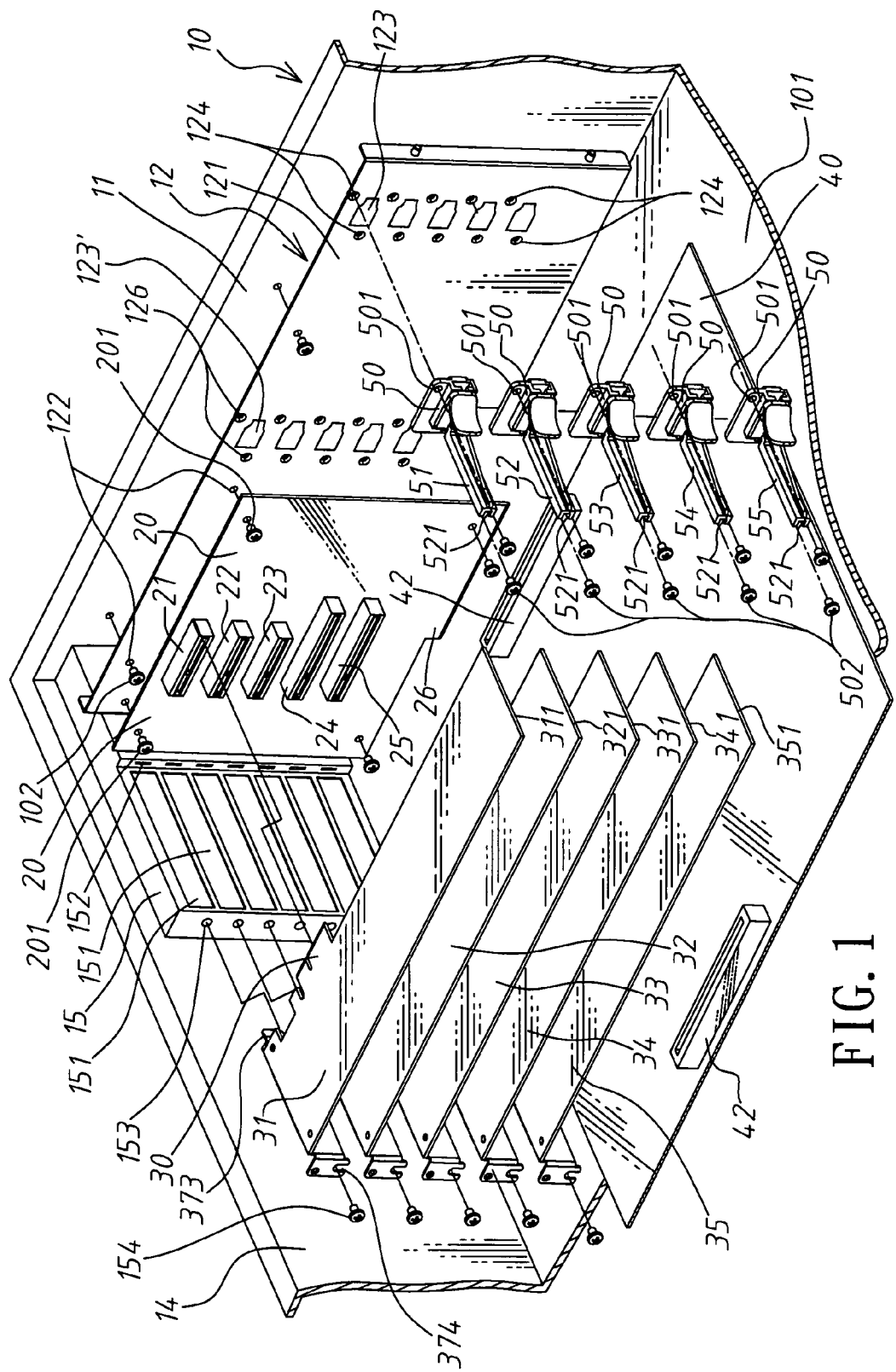
FIG. 1 shows an exploded view of parts of the present invention wherein five pieces of PCI standard file cards are connected in a computer housing.
Figure 2:
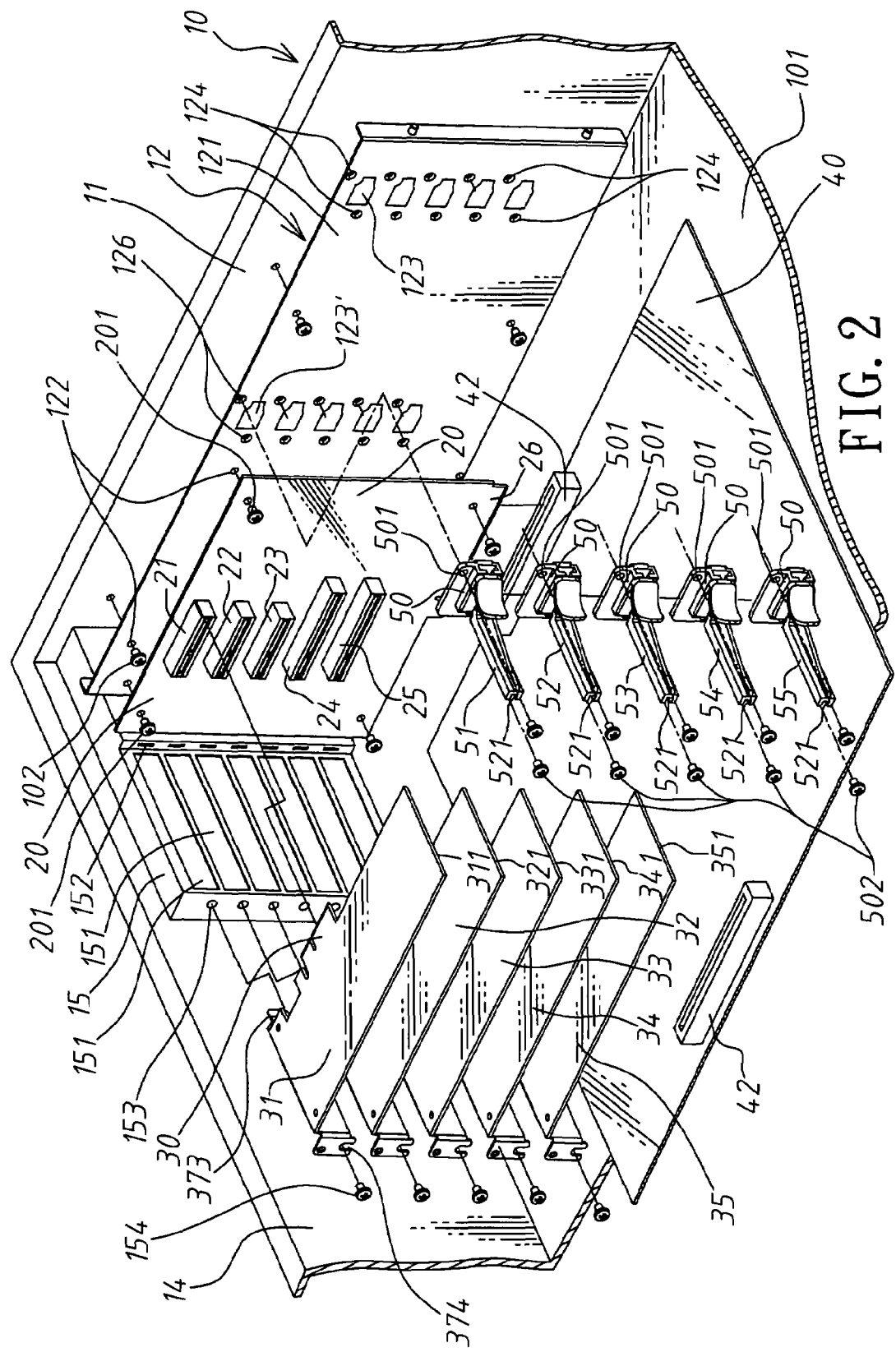
FIG. 2 shows an exploded view of parts of the present invention wherein five pieces of PCI low-profile cards are connected in a computer housing.

Referring to FIG. 1 and FIG. 2, the present invention is to provide a device for assembling transversal PCI expansion cards and a computer housing including a computer housing 10, an internal space 12 of which is fixed with at least one vertical connection board 121 being provided respectively with a first set of connection hole 122 and a second set of connection hole 124; at least one bracket 51, 52, 53, 54, 55 which is connected to a bottom seat 50, with a side of the bottom seat 50 being provided with a connection hole 501, a screw bolt 502 being screwed into the connection hole 501 of the bottom seat 50, and the second set of connection hole 124, and the brackets 51, 52, 53, 54, 55 being provided respectively with horizontal locking slots 521; a vertical riser card 20, which is fixed into the first set of connection hole 122 of the connection board 121 by screw bolts 201, a surface of which is welded with at least one insertion slot 21, 22, 23, 24, 25, and a lower rim of which is provided with an electric connection end 26; at least one transversal PCI expansion card 31, 32, 33, 34, 35, a side of which is provided respectively with a protruded electric connection end 30 being inserted respectively into the insertion slot 21, 22, 23, 24, 25, and a tail end 311, 321, 331, 341, 351 of which is horizontally locked into the locking slot 521, respectively; and a circuit motherboard 40, which is fixed on a bottom board 101 of the computer housing 10, a side of which is provided with at least one insertion slot 42, with the electric connection end 26 of the riser card 20 being inserted vertically into the insertion slot 42.

Figure 3:
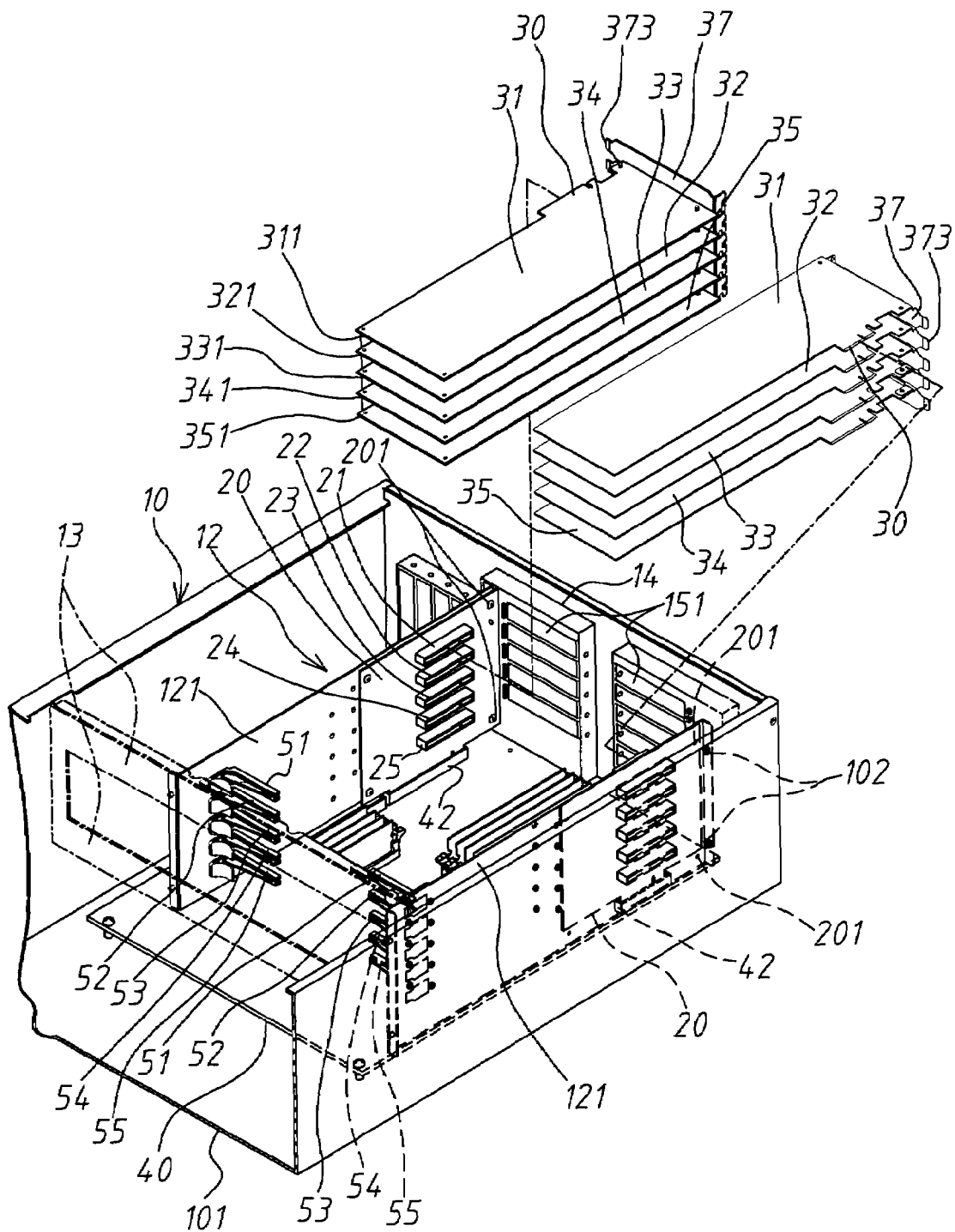
FIG. 3 shows an exploded view of parts of the present invention wherein ten pieces of PCI standard file cards are connected in a computer housing.

Referring to FIG. 1 and FIG. 3, two connection boards 121 are vertically fixed in the internal space 12; two riser cards 20 are vertically fixed on the two connection bards 121, respectively; two sets of the brackets 51, 52, 53, 54, 55, with five pieces per set and a total of ten pieces, are fixed respectively on the two connection boards 121; four sets of the PCI expansion cards 31, 32, 33, 34, 35, with five cards per set and a total of twenty PCI expansion cards 31, 32, 33, 34, 35, are provided with the electric connection ends 30 which are inserted respectively into the insertion slots 21, 22, 23, 24, 25 of the two riser cards 20, and are provided with the tail ends 311, 321, 331, 341, 351 which are locked respectively on the locking slots 521 of the brackets 51, 52, 53, 54, 55; and the circuit motherboard 40 is provided with two insertion slots 42, with two electric connection ends 26 of the two riser cards 20 being inserted respectively into the two insertion slots 42, and with the internal space 12 being transversally fixed with ten PCI expansion cards 31, 32, 33, 34, 35.

Referring to FIG. 1, one connection board 121 is fixed on a vertical side wall 11 of the computer housing 10, and the other connection board 121 is fixed on a transversal rack 13 inside the computer housing 10. These two vertical connection boards 121 are parallel to each other.

Referring to FIG. 1, the connection board 121 is dug out with more than one hole 123 which is located between two neighboring connection holes 124 of the second set. A bottom of the bracket 51, 52, 53, 54, 55 is provided with a sliding block 511, above a front end of which is disposed with a transversal groove 512. In front of the transversal groove 512 is provided with more than one arc-shape projected member 513, above a side of which is provided with a lifting member 514. The sliding block 511 is slidingly inserted into a locking slot 57, and the arc-shape projected member 513 is positioned into a positioning hole 59.

On a surface of the connection board 121, at a location between the connection hole 122 of the first set and the connection hole 124 of the second set, is disposed with a connection hole 126 of a third set, and the hole 123 is located between every two neighboring connection holes 126 of the third set.

The bottom seat 50 is screwed into the connection hole 126 of the third set, a projected block 58 of the bottom seat 50 is latched into the hole 123, and the bracket 51, 52, 53, 54, 55 is fixed at the bottom seat 50.

In addition, tail ends of PCI low-profile cards 31, 32, 33, 34, 35 can be locked into the locking slots 521 of the brackets 51, 52, 53, 54, 55.

Referring to FIG. 1, it shows a local exploded view of the present invention which is implemented to an insertion of five PCI expansion cards 31, 32, 33, 34, 35.

Referring to FIG. 3, the internal space 12 of the computer housing 10 of the present invention is inserted with ten PCI expansion cards 31, 32, 33, 34, 35, and includes two connection boards 121 of a same shape. FIG. 1 discloses that one of the connection boards 121 is screwed on one side wall 11 of the internal space 12 by screw bolts 102, 201, and the riser card 20 is vertically fixed on the other connection board 121 by the screw bolts 201.

Figure 5:
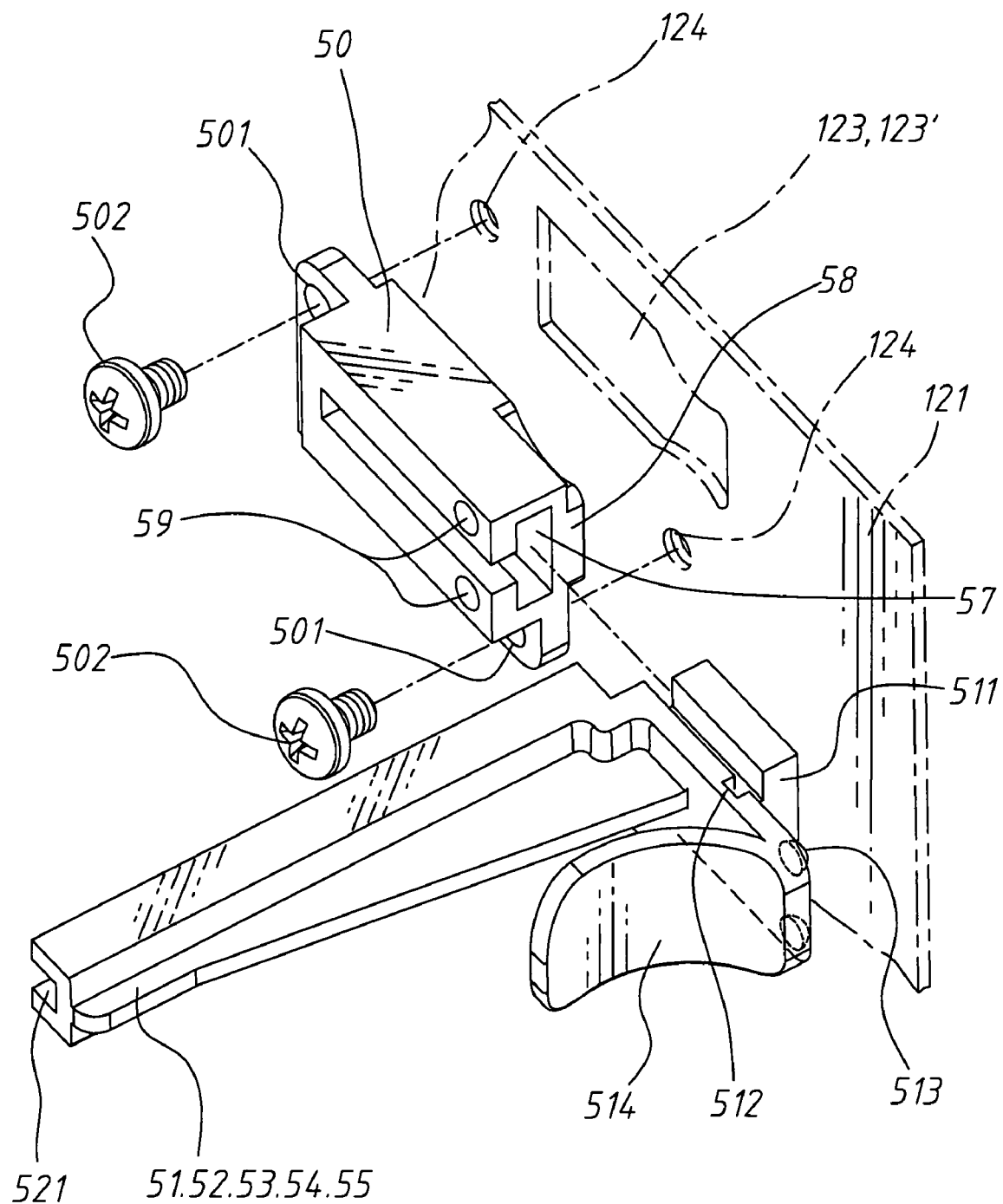
FIG. 5 shows an exploded view of parts of the present invention wherein a bracket is fixed at a connection board.

Referring to FIG. 5, five brackets 51, 52, 53, 54, 55 are provided with the sliding blocks 511 which are slidingly inserted into the locking slots 57.

Figure 6:
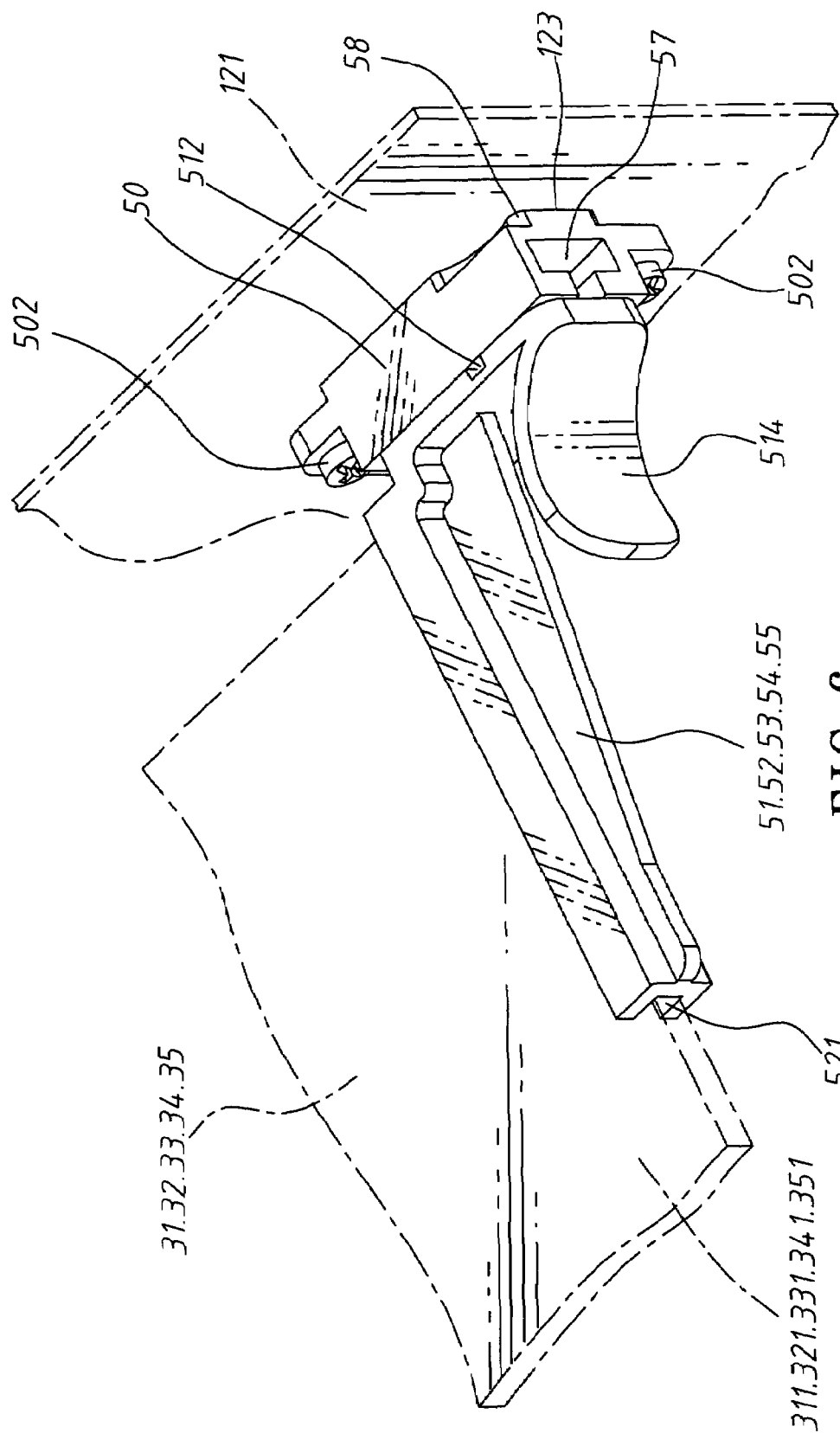
FIG. 6 shows a perspective view of parts of the present invention wherein a bracket is fixed at a connection board.
Figure 7:
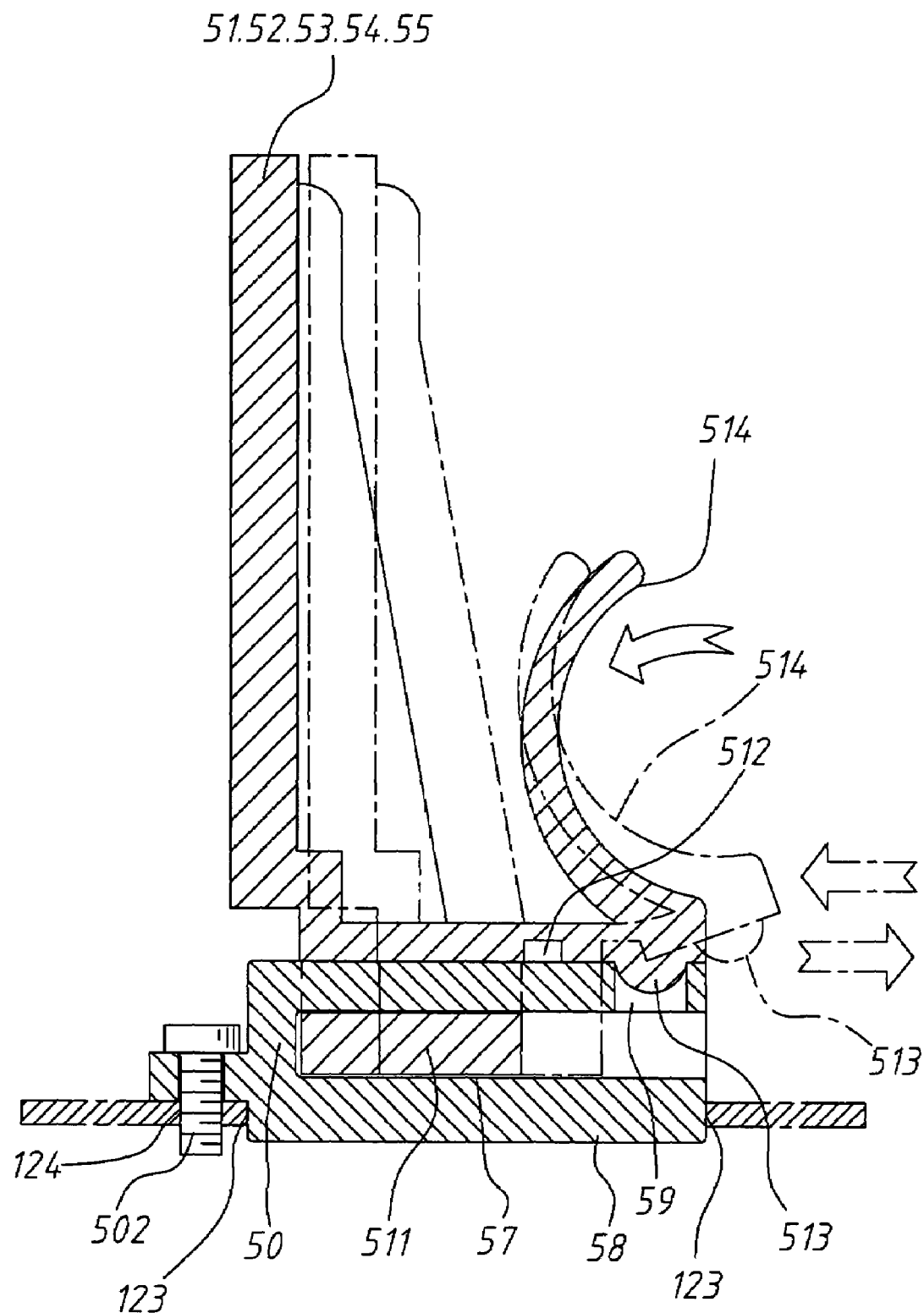
FIG. 7 shows a cross-sectional view of the present invention wherein a bracket and a bottom seat are slidingly displaced with respect to each other.

Referring to FIG. 7, upon pressing and exerting force to the lifting members 514, the brackets 51, 52, 53, 54, 55 will be displaced and deformed upward elastically (flexible) along the transversal grooves 512, which serve as boundary lines. After the arc-shape projected members 513 have been displaced and sliding into the positioning holes 59, moment of force will be released, and the brackets 51, 52, 53, 54, 55 will be elastically restored to be fixed on the bottom seats 50. Next, the projected blocks 58 are locked into the holes 123 having a same shape as that of the projected blocks 58, which prevents the brackets 51, 52, 53, 54, 55 from being displaced on the connection board 121 by other force. Then, the screw bolts 502 are screwed into the connection holes 501, and the connection holes 124 of the second set. Therefore, as shown in FIG. 6, the plural brackets 51, 52, 53, 54, 55 will be stably fixed on the connection board 121 by the bottom seats 50, thereby allowing the brackets 51, 52, 53, 54, 55 to be quickly assembled with or dismantled from the bottom seats 50.

Figure 8:
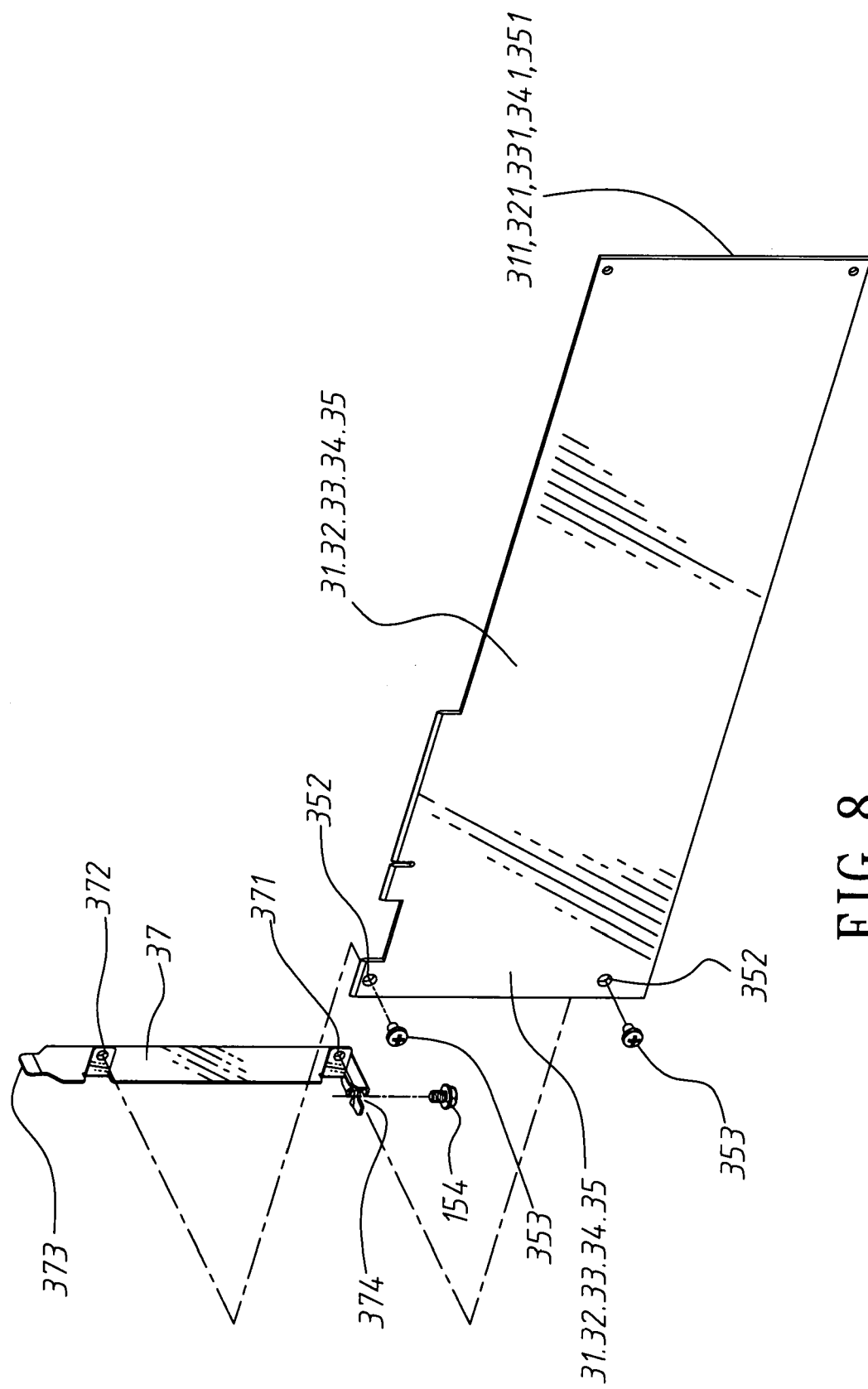
FIG. 8 shows an exploded view of the present invention wherein a PCI card is connected with a masking piece.

Referring to FIG. 8, the PCI expansion cards 31, 32, 33, 34, 35 can be the PCI standard file cards, or can be the PCI low-profile cards. A proper position at a front end of the PCI expansion card is provided with two connection holes 352, connection parts of a masking piece 37 are provided respectively with connection holes 371, 372, and screw bolts 353 are screwed into the connection holes 352, 371, 372, allowing the masking piece 37 to be fixed at the front end of the PCI expansion card 31, 32, 33, 34, 35. An end of the masking piece 37 is provided with an insertion end 373, and the other end is provided with a notch 374. As shown in FIG. 2, another side wall 14 of the computer housing 10 is connected with the side wall 11 at an intersection angle of 90 degrees, and a wall surface of the side wall 14 is provided with a frame 15 which is protruded inward and is provided with a plurality of long through-holes 151, with two side walls of the long through-hole 151 being provided respectively with an insertion hole 151 and a screw hole 153. After the insertion end 373 of the masking piece 37 has been inserted into the insertion hole 152, and a screw bolt 154 has been screwed into the notch 374 and the screw hole 153, the entire masking piece 37 will be positioned on a rim of the long through-hole 151. The tail ends 311, 321, 331, 341, 351 of the PCI expansion cards 31, 32, 33, 34, 35 are locked respectively into the locking slots 521, and the electric connection end 30 of each PCI expansion card 31, 32, 33, 34, 35 is inserted into the insertion slot 21, 22, 23, 24, 25, to form a conductive connection between the PCI expansion cards 31, 32, 33, 34, 35 and the insertion slots 21, 22, 23, 24, 25. Accordingly, the PCI expansion cards 31, 32, 33, 34, 35 are stably positioned inside the internal space 12, and are parallel and superimposed in the internal space 12. The electric connection end 26 of the riser card 20 is inserted into the insertion slot 42 of the circuit motherboard 40 which conductively connects with the riser card 20 through the insertion slot 42 and the riser card 20, allowing the circuit motherboard 40 to transmit or access data signals of the PCI expansion cards 31, 32, 33, 34, 35.

Referring to FIG. 2, on the surface of the connection board 121, at the location between the connection hole 122 of the first set and the connection hole 124 of the second set, is provided with the connection hole 126 of the third set. A hole 123' is located between every two neighboring connection holes 126 of the third set. The bottom seat 50 is screwed into the connection hole 126 of the third set, and the projected block 58 is latched into the hole 123'. Therefore, the brackets 51, 52, 53, 54, 55 are fixed at the bottom seats 50, and can be selectively fixed on a middle surface of the connection board 121, so as to allow the slots 521 on the brackets 51, 52, 53, 54, 55 to be locked into the PCI low-profile cards 31, 32, 33, 34, 35, thereby allowing the expansion cards to be effectively fixed when the present invention is implemented to the PCI low-profile cards.

Figure 4:
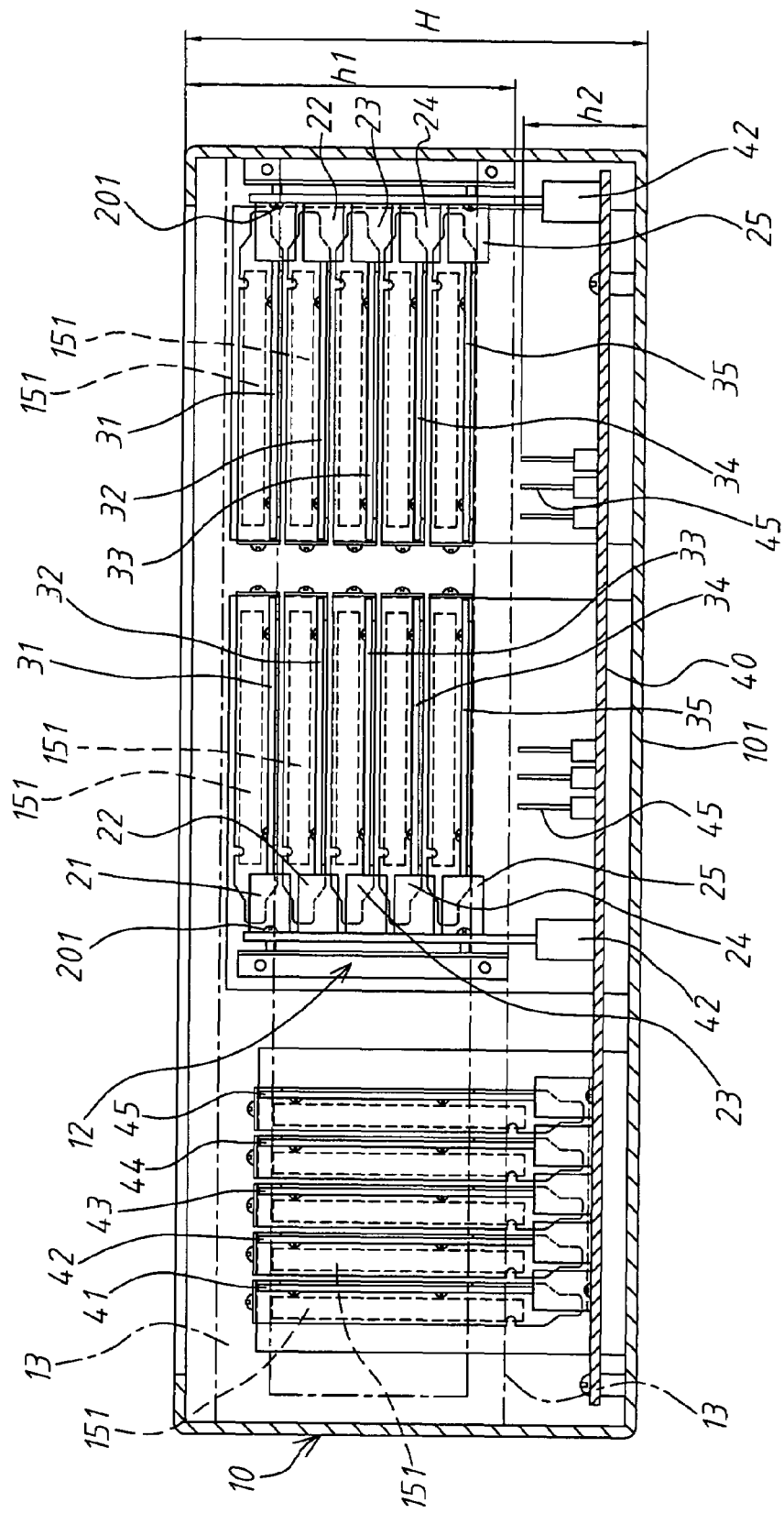
FIG. 4 shows a cross-sectional view of the present invention wherein ten pieces of PCI standard file cards are connected in a computer housing.

Referring to FIG. 4, an existing memory card 45 which is inserted on the circuit motherboard 40 belongs to a prior art, and an entire height h2 of the memory card 45 is about 36 mm; whereas, a height H of the 4 U computer housing 10 is about 177 mm, and a height h1 of the first insertion slot 21 to the fifth insertion slot 25 is about 101.6 mm. Accordingly, the PCI expansion cards 31, 32, 33, 34, 35 that are parallel and superimposed to one another and are inserted into the first, second, third, fourth, fifth insertion slot 21, 22, 23, 24, 25 can be easily and successfully installed above the memory card 45, so as to achieve an effect of sufficiently utilizing the internal space 12. Furthermore, in association with five existing expansion cards 41, 42, 43, 44, 45 which are vertically inserted above a left side of the circuit motherboard 40 (the prior art), a total of fifteen PCI expansion cards can be inserted by the present invention.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A device for assembling transversal PCI expansion cards and a computer housing, comprising a computer housing, an internal space of which is fixed with at least one vertical connection board being provided respectively with a first set of connection hole and a second set of connection hole; at least one bracket which is connected to a bottom seat, with a side of the bottom seat being provided with a connection hole, a screw bolt being screwed into the connection hole of the bottom seat, and the second set of connection hole, and the brackets being provided respectively with horizontal locking slots; a vertical riser card, which is fixed into the first set of connection hole of the connection board by screw bolts, a surface of which is welded with at least one insertion slot, and a lower rim of which is provided with an electric connection end; at least one transversal PCI expansion card, a side of which is provided respectively with a protruded electric connection end being inserted respectively into the insertion slot, and a tail end of which is horizontally locked into the locking slot, respectively; and a circuit motherboard, which is fixed on a bottom board of the computer housing, a side of which is provided with at least one insertion slot, with the electric connection end of the riser card being inserted vertically into the insertion slot.

2. The device for assembling transversal PCI expansion cards and a computer housing, according to claim 1, wherein two connection boards are vertically fixed in the internal space; two riser cards being vertically fixed on the two connection boards, respectively; a total of ten brackets, with five brackets per set, being fixed on the two connection boards, respectively; a total of ten PCI expansion cards, with five cards per set, being provided with electric connection ends which are inserted respectively into the insertion slots of the two riser cards, and being provided with tail ends which are locked respectively on the locking slots of the brackets; and the circuit motherboard, being provided with two insertion slots, with two electric connection ends of the two riser cards being inserted respectively into the two insertion slots, allowing ten PCI expansion cards to be transversally fixed in the internal space.

3. The device for assembling transversal PCI expansion cards and a computer housing, according to claim 1, wherein one connection board is fixed on a vertical side wall of the computer housing, and the other connection board is fixed on a transversal rack inside the computer housing; these two vertical connection boards being parallel to each other.

4. The device for assembling transversal PCI expansion cards and a computer housing, according to claim 1, wherein the connection board is dug out with more than one hole which is located between two neighboring holes of the second set; a bottom of the bracket being provided with a sliding block, above a front end of the sliding block being provided with a transversal groove, in front of the transversal groove being provided with more than one arc-shape projected member, and above a side of the arc-shape projected member being provided with a lifting member, with the sliding block slidingly inserted into the locking slot, and the arc-shape projected body being positioned into a positioning hole.

5. The device for assembling transversal PCI expansion cards and a computer housing, according to claim 1, wherein on a surface of the connection board, at a location between the connection hole of the first set and the connection hole of the second set, is provided with a connection hole of a third set, with a hole being located between every two neighboring connection holes of the third set; the bottom seat being screwed into the connection hole of the third set, the projected block of the bottom seat being latched into the hole, and the bracket being fixed at the bottom seat; and tail ends of PCI low-profile cards being locked into the locking slots of the brackets.

* * * * *